United States Patent [19]

Nishiguchi

[11] Patent Number: 5,536,974
[45] Date of Patent: Jul. 16, 1996

[54] SEMICONDUCTOR DEVICE WITH LIGHT REFLECTING SUBSTRATE AREA

[75] Inventor: Masanori Nishiguchi, Yokohama, Japan

[73] Assignee: Sumitomo Electric Industries, Ltd., Osaka, Japan

[21] Appl. No.: 64,658

[22] Filed: May 21, 1993

[30] Foreign Application Priority Data

May 22, 1992 [JP] Japan ................................. 4-130743
May 22, 1992 [JP] Japan ................................. 4-130744
May 22, 1992 [JP] Japan ................................. 4-130745

[51] Int. Cl.$^6$ ................................................ H01L 23/48
[52] U.S. Cl. ............................ 257/778; 257/797; 257/98; 257/99
[58] Field of Search .......................... 257/778, 737, 257/797, 98, 99, 81, 433, 436

[56] References Cited

U.S. PATENT DOCUMENTS

| | | | |
|---|---|---|---|
| 4,640,888 | 2/1987 | Itoh et al. | 430/323 |
| 4,899,921 | 2/1990 | Bendat et al. | 228/105 |
| 5,022,580 | 6/1991 | Pedder | 257/797 |
| 5,153,707 | 10/1992 | Makino et al. | 357/70 |
| 5,214,272 | 5/1993 | Ueno | 257/435 |

FOREIGN PATENT DOCUMENTS

| | | |
|---|---|---|
| 0126621 | 11/1984 | European Pat. Off. . |
| 462596 | 12/1991 | European Pat. Off. . |
| 8908926 | 9/1989 | WIPO . |

OTHER PUBLICATIONS

Patent Abstracts of Japan, vol. 6, No. 144 (E-122)(1022) Aug. 3, 1982 & JP-A-57 068 058 (Hitachi Seisakusho K.K.) * abstract *.

Patent Abstracts of Japan, vol. 10, No. 95 (E-395)(2152) Apr. 12, 1986 & JP-A-60 239 050 (Sharp K.K.) * abstract *.

Patent Abstracts of Japan, vol. 5, No. 192 (E-85)(864) Dec. 8, 1981 & JP-A-56114343 (Terumetsuku K.K.) * abstract *.

Primary Examiner—Rolf Hille
Assistant Examiner—Roy Potter
Attorney, Agent, or Firm—Cushman Darby & Cushman

[57] ABSTRACT

A semiconductor device having a high packaging yield is disclosed. A light directed to a light reflection area (20) formed on a packaging substrate (10) is reflected with an accurate angle. A light directed to a second light reflection area (50) formed on a semiconductor chip (40) is also reflected with an accurate angle. A relative inclination between the packaging substrate (10) and the semiconductor chip (40) is measured based on the reflection angles of the reflected lights.

18 Claims, 13 Drawing Sheets

5,536,974

SEMICONDUCTOR DEVICE WITH LIGHT REFLECTING SUBSTRATE AREA

BACKGROUND OF THE INVENTION

1. Field of the Invention

The present invention relates to semiconductor device used in Si-LSI, GaAs-LSI and liquid crystal display(LCD).

2. Related Background Art

In packaging a flip chip, all bumps formed on a semiconductor chip are connected to pads of a substrate. To this end, a technique to keep parallelism between the semiconductor chip and the substrate is very important. A prior art technique to keep parallelism between the semiconductor chip and the substrate includes a method which uses an optical probe. In this method, a probe light is directed to the semiconductor chip and the substrate, a relative inclination between the semiconductor chip and the substrate is measured based on a reflected light, and the parallelism therebetween is adjusted based on the measurement.

Since a recent semiconductor chip is highly integrated, there are many fine ruggedness on the surface of the semiconductor chip. Thus, even if the probe light is directed to the semiconductor chip by using the optical probe, the light is scattered by the fine ruggedness on the surface of the semiconductor chip so that it is difficult to measure the relative inclination between the substrate and the semiconductor chip.

Further, there are a number of fine ruggedness on a surface of a packaging substrate which is basically a ceramic substrate such as $Al_2O_3$ or AlN, or a porous metal such as CuW. As a result, even if the probe light is directed to the packaging substrate by using the optical probe, the light is scattered by the fine ruggedness on the surface of the packaging substrate so that it is difficult to measure the inclination of the packaging substrate.

SUMMARY OF THE INVENTION

It is an object of the present invention to provide a semiconductor device comprising substrate having a light reflecting area selectively formed on a required region for a packaging surface of a semiconductor chip.

In the present invention, when the parallelism of the packaging substrate is adjusted by using measurement means, a light is irradiated to the light reflection area formed in the packaging substrate, and the inclination of the packaging substrate is determined based on the reflection angle. Since the light reflection area is formed to have a flat surface, an error included in the reflection angle of light from the light reflection area is very small. Accordingly, the precision in adjusting the parallelism of the packaging substrate is improved.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

Figure 1:
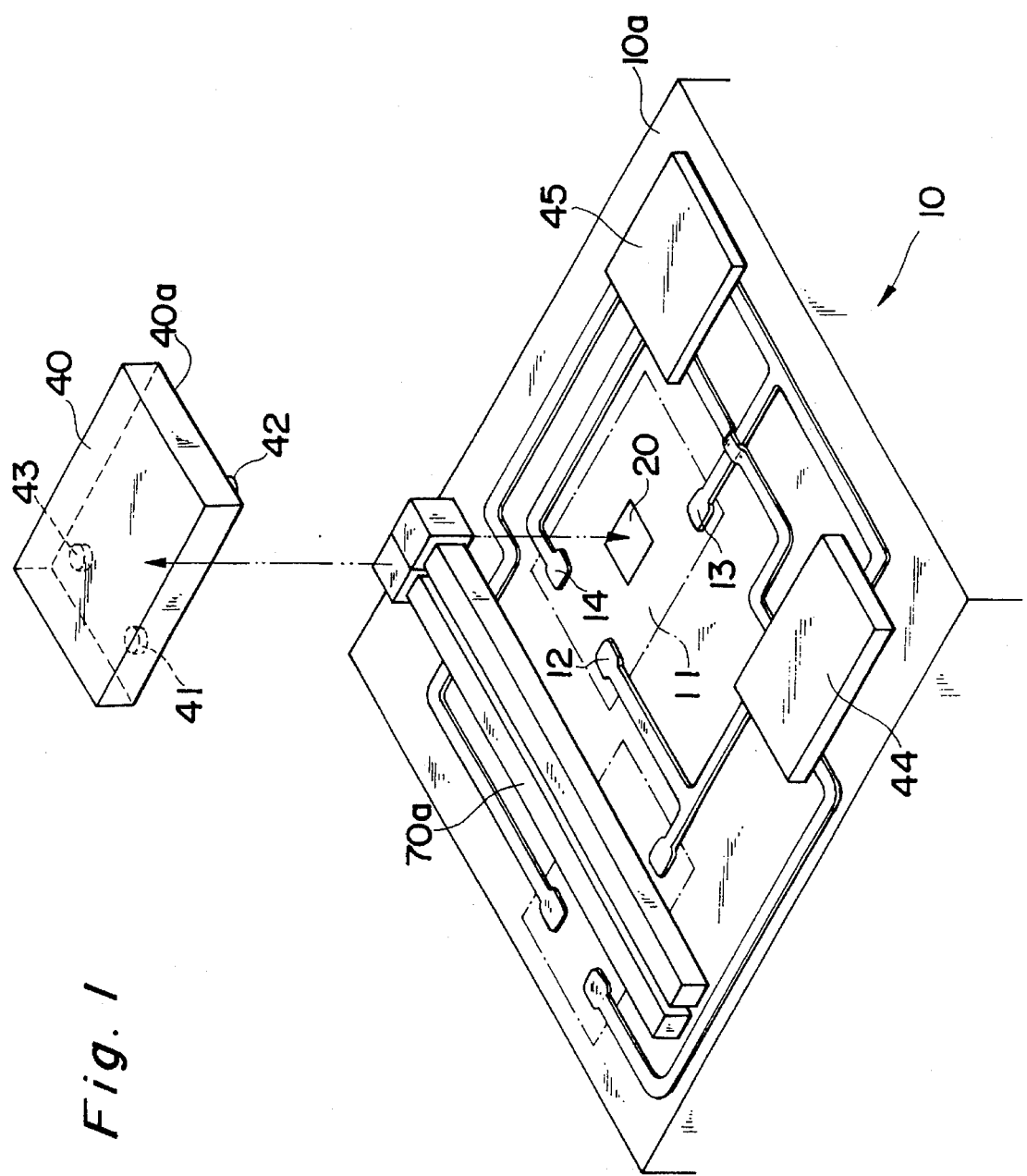
FIG. 1 shows a perspective view of an external view of a packaging apparatus in an embodiment.

One embodiment of the present invention is now described with reference to the accompanying drawings. FIG. 1 shows a perspective view of an external view of a packaging apparatus in one embodiment. A plurality of semiconductor chips 40, 44 and 45 may be mounted on an upper surface 10a of a packaging substrate 10 and metal wirings are formed on the upper surface 10a to interconnect the semiconductor chips 40, 44 and 45. A plurality of bumps 41–43 is formed in a packaging plane 40a of the semiconductor chip 40. A plurality of pads 12–14 which are to face the bumps 41–43 are formed in a packaging area 11 on the upper surface 10a on which the semiconductor chip 40 is to be packaged, and a flat area 20 having an area of 10–200 µm² is provided at a center of the packaging area 11. The bumps 41–43 formed on the semiconductor chip 40 are connected to the pads 12–14 and the semiconductor chip 40 is packaged on the packaging substrate 10. A ceramic substrate such as $Al_2O_3$ or AlN, or a porous metal such as CuW is used for the packaging substrate 10.

As the scale of the packaging substrate 10 recently increases, it has become difficult to make the entire upper surface 10a flat. Particularly when the ceramic is used for the packaging substrate 10, it is more difficult because of warp and twist inherent to the ceramic. As a result, in the case that the upper surface 10a of the packaging substrate 10 has a large area, a relative inclination between a packaging portion on the upper surface 10a and a packaging surface 40a of the semiconductor chip 40 differs depending on which part the semiconductor chip 40 is packaged on.

Thus, it is not sufficient to adjust the parallelism between the entire upper surface 10a of the packaging substrate 10 and the packaging surface 40a of the semiconductor chip 40, and it is further necessary to adjust the parallelism between a portion of the upper surface 10a of the packaging substrate 10 and the packaging surface 40a of the semiconductor chip 40.

One of methods for adjusting the parallelism between the upper surface 10a of the packaging substrate 10 and the packaging surface 40a of the semiconductor chip 40 uses an optical probe 70a. In this adjustment method, the optical probe 70a is arranged between the packaging substrate 10 and the semiconductor chip 40 and two probe lights are emitted to the packaging substrate 10 and the semiconductor chip 40. By measuring the reflection angles of the probe lights at the packaging substrate 10 and the semiconductor chip 40, a relative inclination between the upper surface 10a of the packaging substrate 10 and the packaging plane 40a of the semiconductor chip 40 is detected. Based on the detection, a relative parallelism between the upper surface 10a of the packaging substrate 10 and the packaging plane 40a of the semiconductor chip 40 is adjusted. In the present embodiment, since the flat area 20 for reflecting the probe light is provided in the upper surface 10a of the packaging substrate 10, the reflection angle of the probe light at the packaging substrate 10 is accurate.

Figure 2:
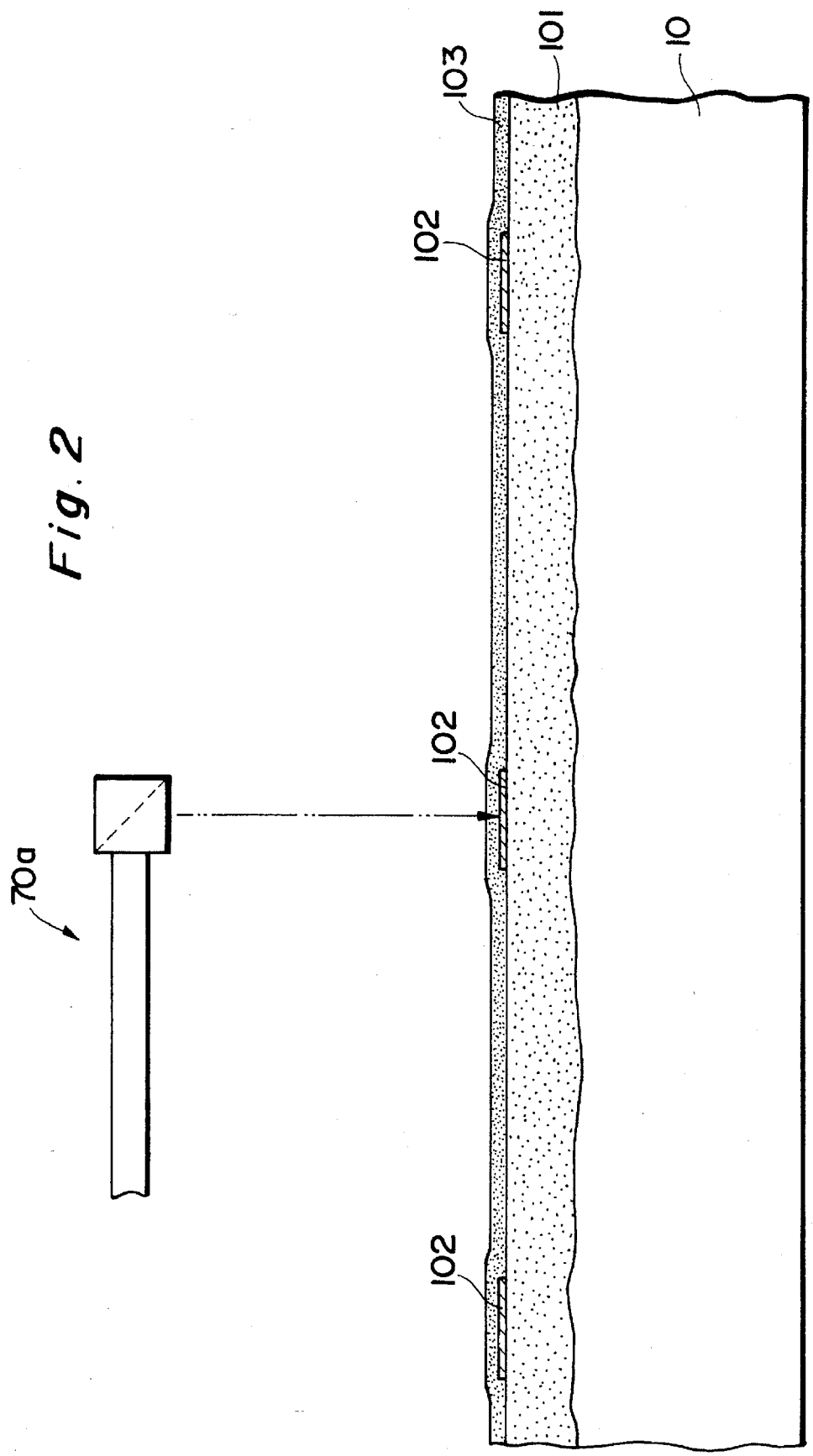
FIG. 2 shows a sectional view of a structure of a flat area 20, which is formed on the packaging substrate shows FIG. 1.

As shown in FIG. 2, the flat area 20 has a three-layer structure having an insulation film 101, a metal layer 102 and an insulation film 103 sequentially laminated on the packaging substrate 10. The insulating film 101 is applied as an underlying layer of the metal layer 102 which is used as a reflection mirror surface for the probe light, by the following reason. The upper surface 10a of the packaging substrate 10 has more ruggedness than the surface of the semiconductor chip 40 which uses a mirror-finished wafer such as GaAs or Si as a base material. For example, an $Al_2O_3$ ceramic substrate having a surface thereof not polished has ruggedness in the order of $R_{max}$=10 µm. A substrate which uses CuW as a base material has ruggedness in the order of $R_{max}$=5 µm even after the surface is polished. Accordingly, when the metal layer 102 is deposited directly on the packaging substrate 10, similar unevenness appears on the surface of the metal layer 102 so that the probe light may not be reflected exactly. In the present embodiment, the insulation film 101 of a sufficient thickness is applied to the packaging substrate 10 to make the surface of the insulation film 101 flat, and the metal layer 102 is deposited on the insulation film 101 so that the metal layer 102 having a flat surface is formed.

Figure 3:
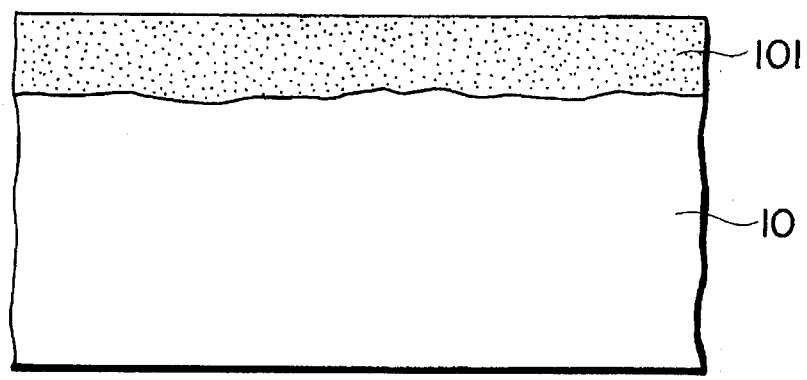
FIG. 3 shows a manufacturing process of the flat area 20, which is formed on the packaging substrate shows FIG. 1.
Figure 4:
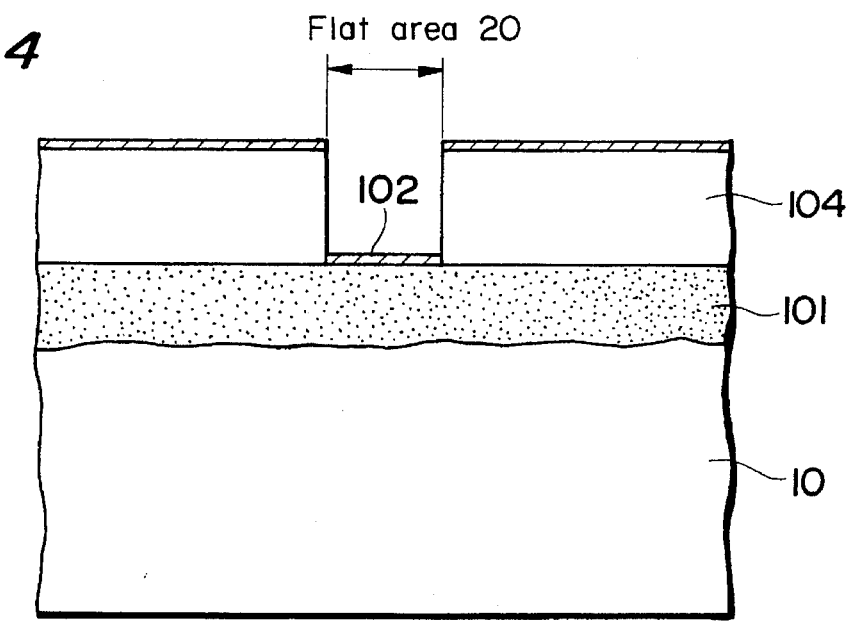
FIG. 4 shows a manufacturing process of the flat area 20, which is formed on the packaging substrate shows FIG. 1.
Figure 5:
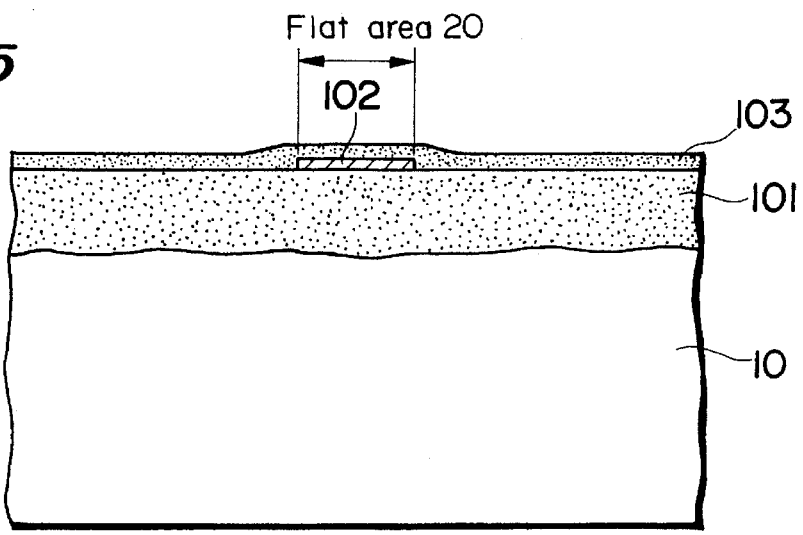
FIG. 5 shows a manufacturing process of the flat area 20, which is formed on the packaging substrate shows FIG. 1.

A manufacturing process of the flat area 20 is shown in sectional views of FIGS. 3 to 5. First, an insulative material is applied to the packaging substrate 10 to a thickness of 5 µm or more by a spin coat method, for example, to form the insulation film 101 (see FIG. 3). As the insulative material, PI (polyimide), BCB (benzocyclobetene) or SOG (spin-on-glass) may be used. Alternatively, those materials, may be sequentially applied to form a multi-layer insulation film 101. Then, a resist pattern having an opening in an area in which the flat area 20 is to be formed is formed on the insulation film 101, and the metal layer 102 such as Au, Cu or Al is sputter-deposited by using the resist pattern as a mask (see FIG. 4). After the resist pattern 104 has been removed, an insulation film material is deposited by a plasma CVD method, for example, to form the insulation film 103 (see FIG. 5). The insulation film material may be SiN (refractive index n is approximately 1.9), SiON (n is approximately 1.85) or $SiO_2$ (n is approximately 1.4). The insulation film 103 is preferably deposited to a thickness which meets a relationship of $\lambda/2 \times m = n \times d$, where $\lambda$ is a wavelength of the probe light, m is an integer and d is a film thickness. If the film thickness meets the above relationship, a reflection factor of the probe light which is reflected by the metal layer 102 of the flat area 20 is maximum and the reduction of the light intensity of the probe light by the insulation film 103 is minimized.

Figure 6:
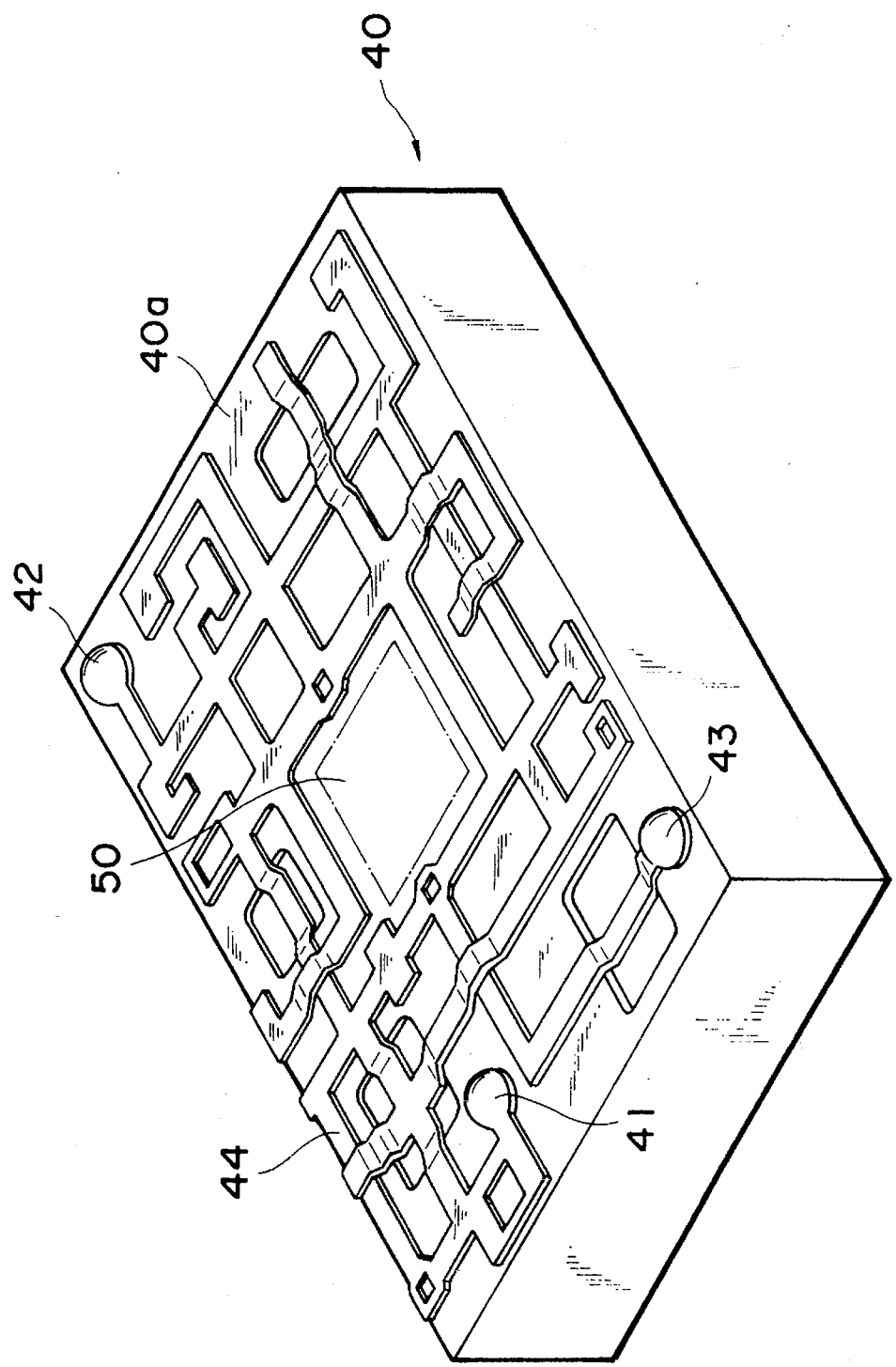
FIG. 6 shows a perspective view of a structure of a packaging plane of a semiconductor chip.
Figure 7:
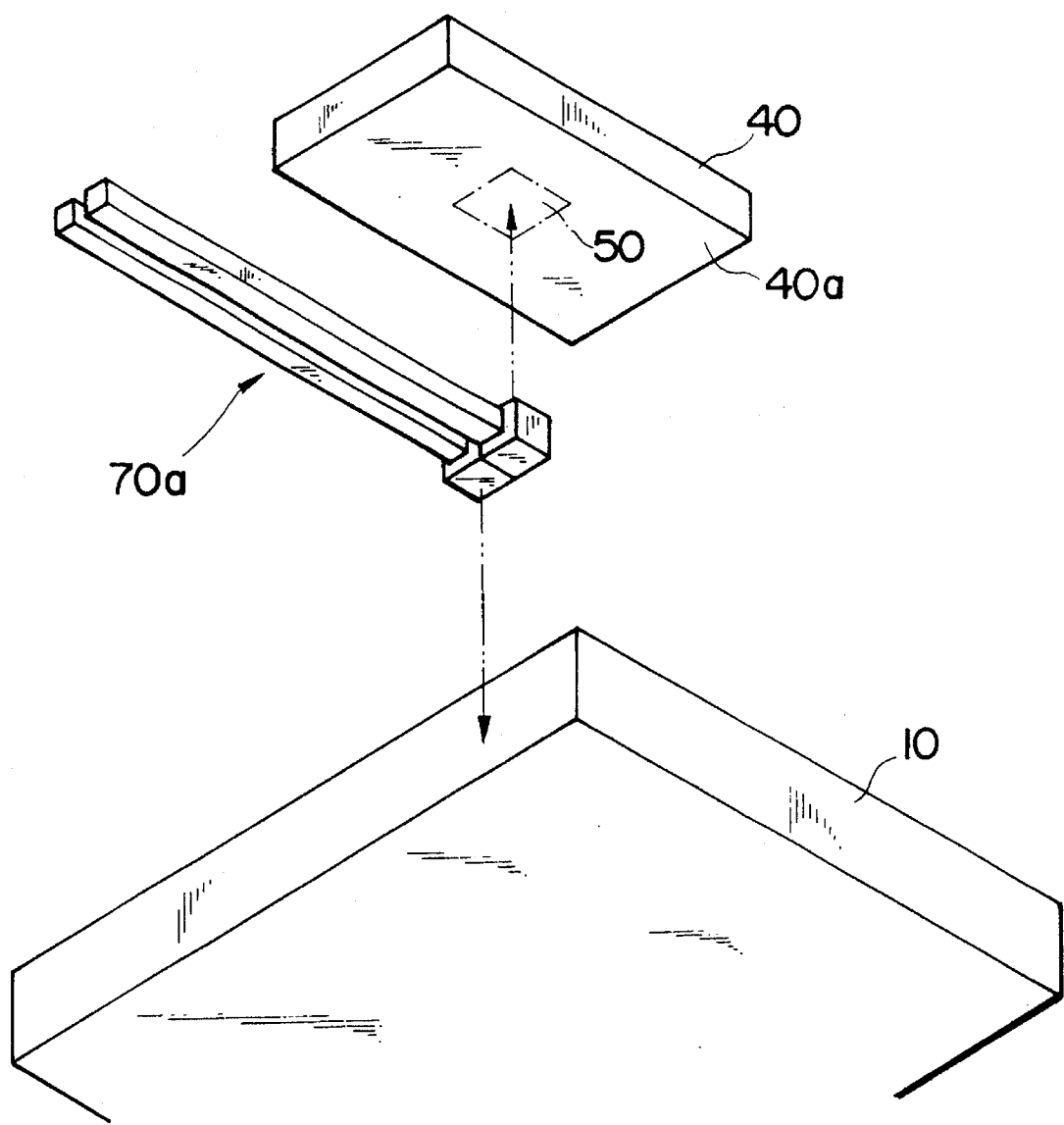
FIG. 7 shows a perspective view for illustrating measurement of parallelism between the semiconductor chip and the packaging substrate.

FIG. 6 shows a perspective view of the semiconductor chip 40 having a flat area 50 in the packaging plane 40a as the packaging substrate 10 has. A metal wiring 44 is formed on the packaging plane 40a of the semiconductor chip 40 as shown in FIG. 6, and bumps 41–43 are formed at a plurality of areas of the metal wiring 44. A flat area 50 having an area of 10–200 µm² is provided at a center of the packaging plane 40a of the semiconductor chip 40. The flat area 50 is used when the parallelism between the semiconductor chip 40 and the packaging substrate 10 is measured. As shown in FIG. 7, the probe light is reflected with an accurate angle by directing the probe light from the optical probe 70a to the flat area 50 of the semiconductor chip 40.

The flat area 50 may be formed by laminating an insulation film on the metal layer. The insulation film may be SiN (refractive index n is approximately 1.9), SiON (n is approximately 1.85) or $SiO_2$ (n is approximately 1.4). The insulation film is preferably laminated to a thickness which meets a relationship of $\lambda/2 \times m = n \times d$ where $\lambda$ is a wavelength of the probe light, m is an integer and d is a film thickness. When the film thickness meets the above relationship, the reflection factor of the probe light reflected by the metal layer of the flat area 50 is maximum and the reduction of the light intensity of the probe light by the insulation film is minimized. Further, since the flat area 50 is formed at the center of the packaging plane 40a of the semiconductor chip 40, the parallelism between the semiconductor chip 40 and the packaging substrate 10 can be accurately adjusted even if distortion or warp is included in the periphery of the packaging plane 40a.

The flat area 20 and the flat area 50 are preferably arranged in such a positional relation that the areas at least partially overlap when the semiconductor chip 40 is packaged on the packaging substrate 10. The sizes of those areas need not be equal and one area may be covered by the other area.

Since the flat areas 20 and 50 are formed to have flat surfaces, the intensities of the lights reflected by the flat areas 20 and 50 are larger than those of the lights reflected by other areas than the flat areas 20 and 50. As a result, whether the probe light is reflected by the flat area 20 or 50 can be determined by measuring the intensity of the reflected light. Accordingly, where the flat area 20 and the flat area 50 are arranged to partially overlap, coarse positioning of the packaging substrate 10 and the semiconductor chip 40 may be done by moving the packaging substrate 10 and the semiconductor chip 40 parallely to the packaging plane 40a, so that intensities of the lights reflected on the packaging substrate 10 and the semiconductor chip 40 are increased.

Figure 8:
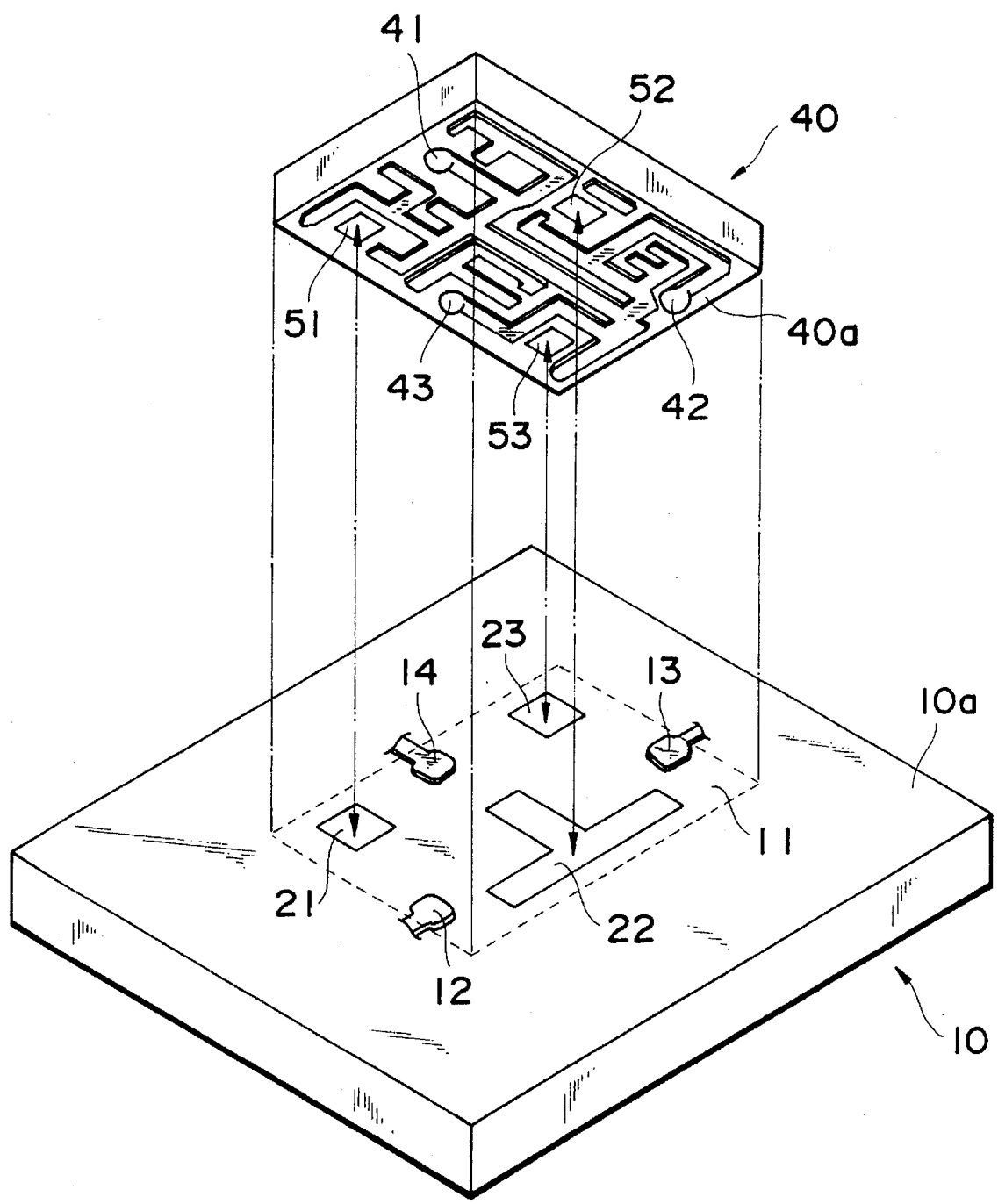
FIG. 8 shows a perspective view of an external view of the packaging substrate and the semiconductor chip having a plurality of flat areas.
Figure 9:
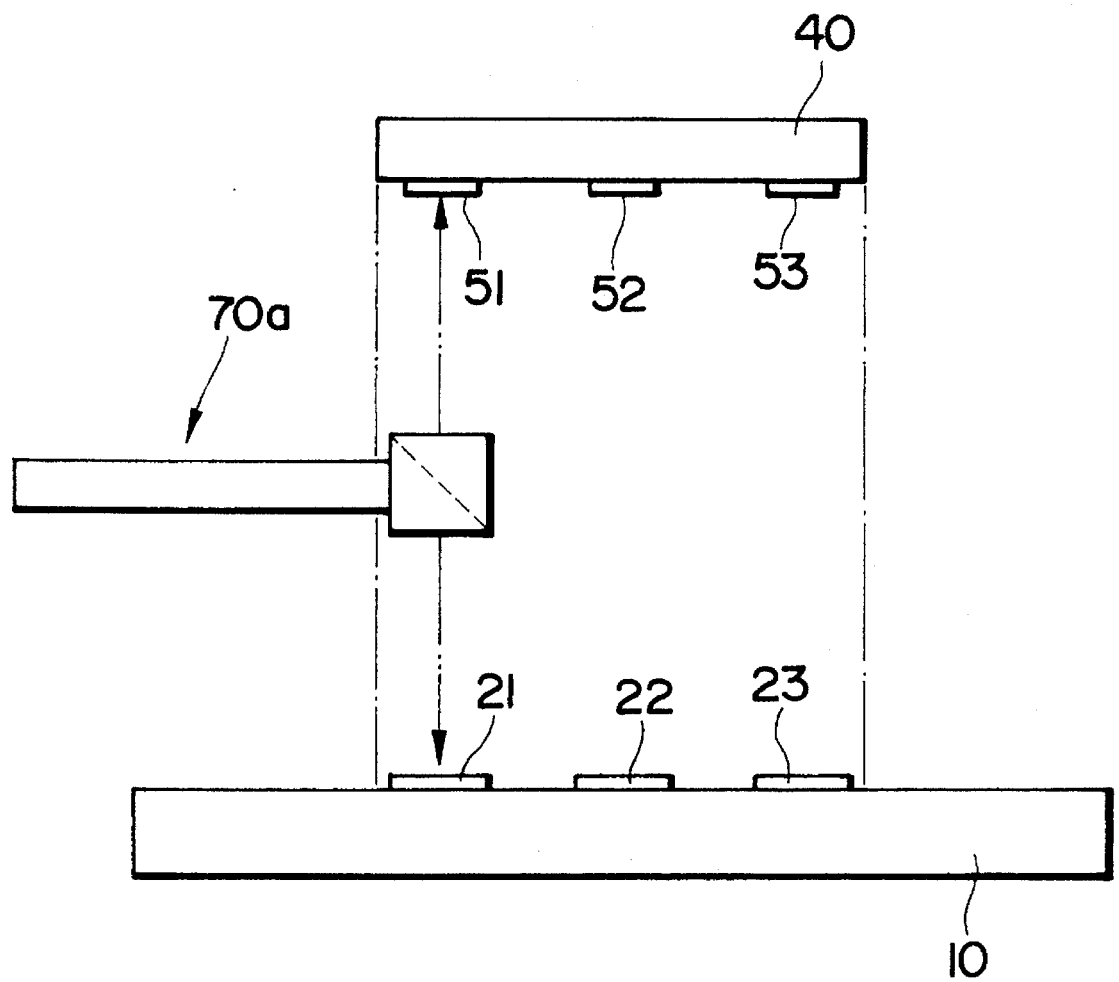
FIG. 9 shows a plan view for illustrating measurement of parallelism between the semiconductor chip and the packaging substrate.

Referring to FIGS. 8 and 9, the adjustment of the parallelism between the packaging substrate 10 and the semiconductor chip 40 by using a plurality of flat areas is explained. FIG. 8 shows a perspective view of an external view of the packaging substrate 10 and the semiconductor chip 40 having a plurality of flat areas. A plurality of bumps 41–43 and flat areas 51–53 are formed on the packaging plane 40a of the semiconductor chip 40. A packaging area 11 is which the semiconductor chip 40 is to be packaged is provided in the upper surface 10a of the packaging substrate 10, and pads 12–14 which are to face the bumps 41–43 and flat areas 21–23 which are to face the flat areas 51–53 are provided in the packaging area 11. The flat areas 21–23 and the flat areas 51–53 are arranged in such a positional relation that the respective areas at least partially overlap when the semiconductor chip 40 is packaged on the packaging substrate 10. Accordingly, the sizes of the respective areas need not be equal and one area may be covered by other area. The size of the respective areas is 10–200 $\lambda m^2$.

As shown in FIG. 9, thee flat areas 21–23 and 51–53 are used as reflection planes of the probe light from the optical probe 70a irradiated to measure the parallelism between the packaging substrate 10 and the semiconductor chip 40. The relative inclination of the packaging substrate 10 and the semiconductor chip 40 can be accurately detected based on the reflection angle by reflecting the probe light by the flat areas 21–23 and 51–53.

Figure 10:
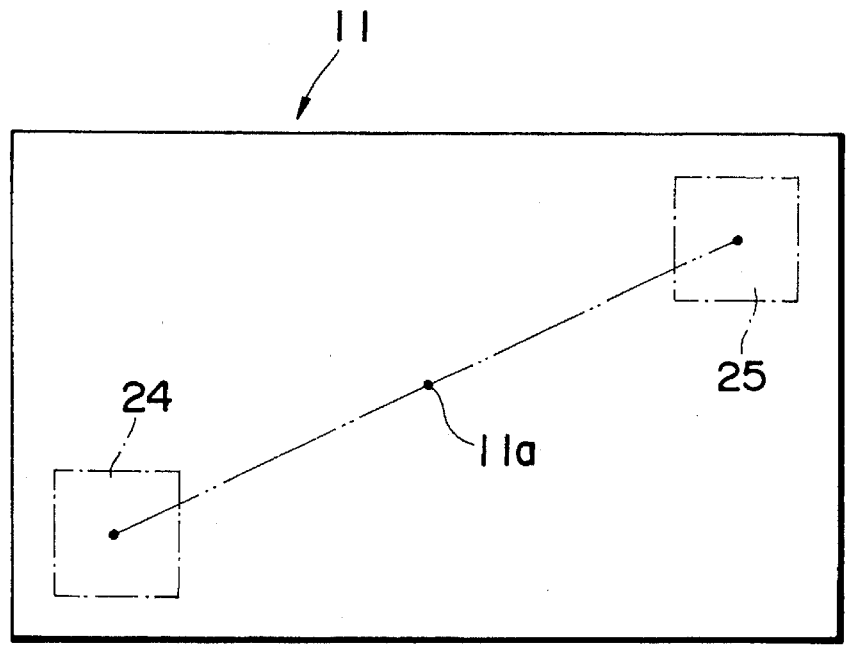
FIG. 10 shows top views of arrangements of the flat area on the packaging area of the packaging substrate.

Arrangements of the flat areas on the packaging area 11 of the packaging substrate 10 are shown in FIGS. 10–14. In FIG. 10, a pair of flat areas 24–25 are provided symmetrically about a center of gravity 11a of the packaging area 11 of the packaging substrate 10. The parallelism may be accurately adjusted even if distortion or warp is included in the entire upper surface 10a, by measuring the parallelism between the packaging substrate 10 and the semiconductor chip 40 at two points by using the flat areas 24 and 25.

Figure 11:
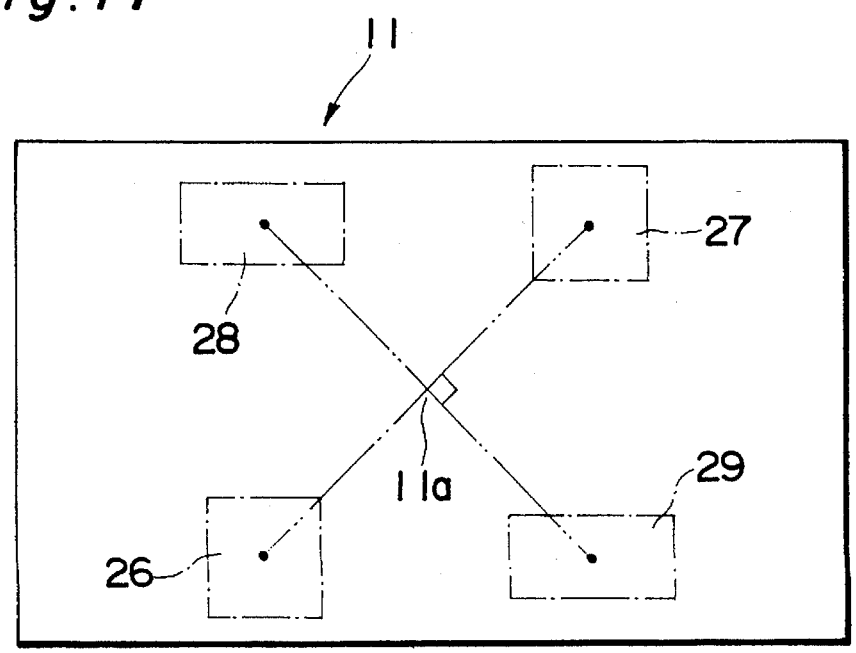
FIG. 11 shows top views of arrangements of the flat area on the packaging area of the packaging substrate.

In FIG. 11, two pairs of flat areas 26 and 27 and flat areas 28 and 29 are provided symmetrically about a center of gravity 11a of the packaging area 11 of the packaging substrate 10. In the present embodiment, the parallelism between the packaging substrate 10 and the semiconductor chip 40 is measured at the four flat areas 26–29 so that the parallelism can be more accurately adjusted than the previous embodiment. In the present embodiment, since the flat areas 26–29 are arranged such that straight lines connecting the pairs of flat areas are substantially normal to each other, the parallelism can be accurately adjusted even if distortion or warp is included in the entire upper surface 10a.

Figure 12:
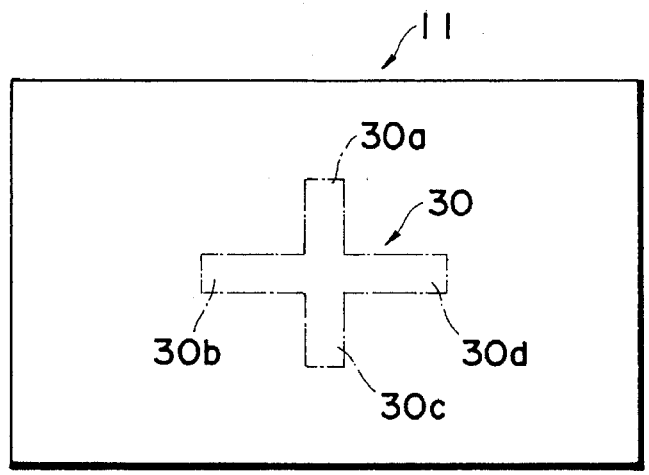
FIG. 12 shows top views of arrangements of the flat area on the packaging area of the packaging substrate.

In FIG. 12, a cross-shaped flat area 30 is provided at the center of the packaging area 11 of the packaging substrate 10. A plurality of measurement points are selected from ends 30a–30d of the flat area 30 to measure to parallelism between the packaging substrate 10 and the semiconductor chip 40. Thus, the parallelism can be accurately adjusted even if distortion or warp is included in the entire upper surface 10a.

Figure 13:
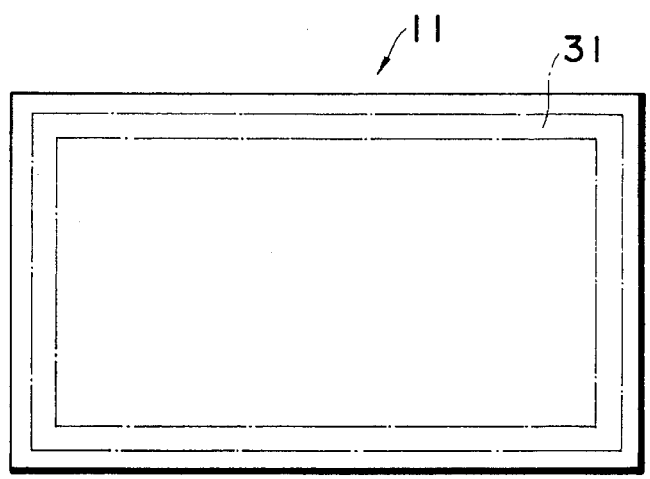
FIG. 13 shows top views of arrangements of the flat area on the packaging area of the packaging substrate.

In FIG. 13, a band-like flat area 31 is provided at a periphery of the packaging area 11 of the packaging substrate 10. A plurality of measurement points on the flat area 31 are selected to measure the parallelism between the packaging substrate 10 and the semiconductor chip 40 so that the parallelism can be accurately adjusted.

Figure 14:
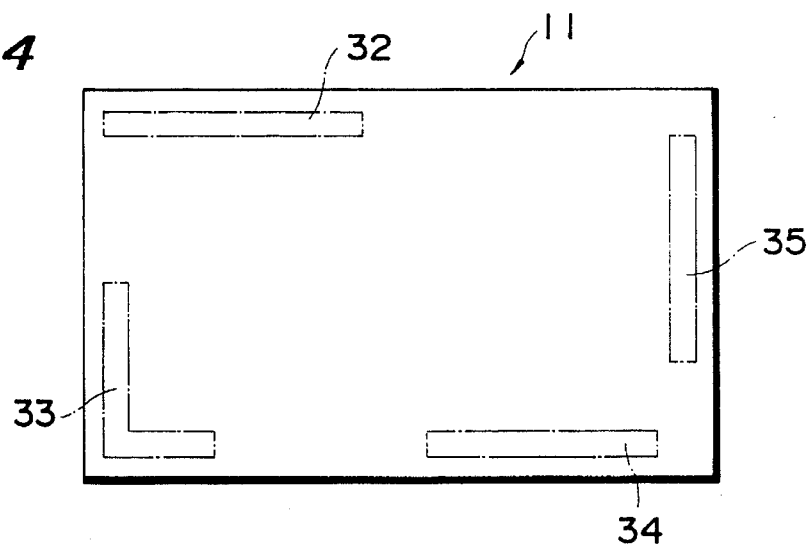
FIG. 14 shows top views of arrangements of the flat area on the packaging area of the packaging substrate.

FIG. 14 shows a modification of the embodiment of FIG. 13. A plurality of flat areas 32–35 are provided at the periphery of the packaging area 11 of packaging substrate 10. The parallelism can be accurately adjusted, as it is in the embodiment of FIG. 13, by using the flat areas 32–35.

Figure 15:
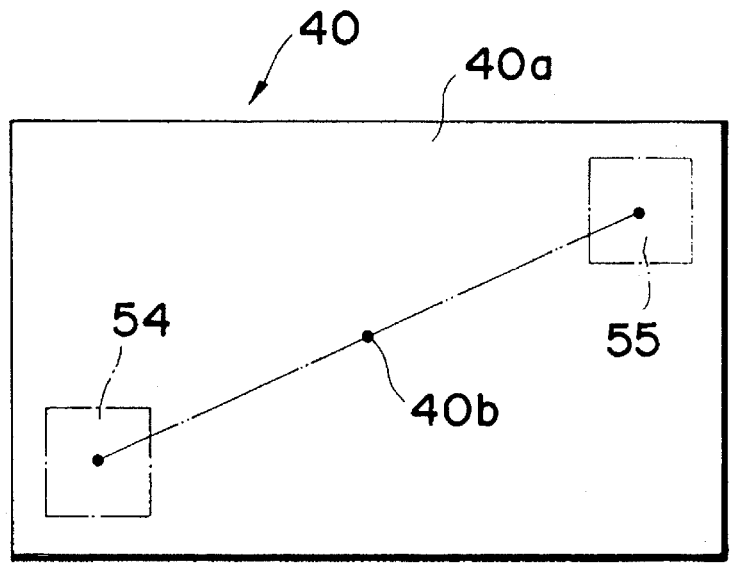
FIG. 15 shows top views of arrangements of the flat area on the semiconductor chip.

Arrangements of the flat areas on the semiconductor chips 40 are shown in FIGS. 15–19. In FIG. 15, a pair of flat areas 54 and 55 are provided symmetrically about a center of gravity 40b of the packaging plane 40a of the semiconductor chip 40. By measuring the parallelism between the semiconductor chip 40 and the packaging substrate 10 at two points by using the flat areas 54 and 55, the parallelism can be accurately adjusted even if distortion or warp is included in the entire packaging plane 40a.

Figure 16:
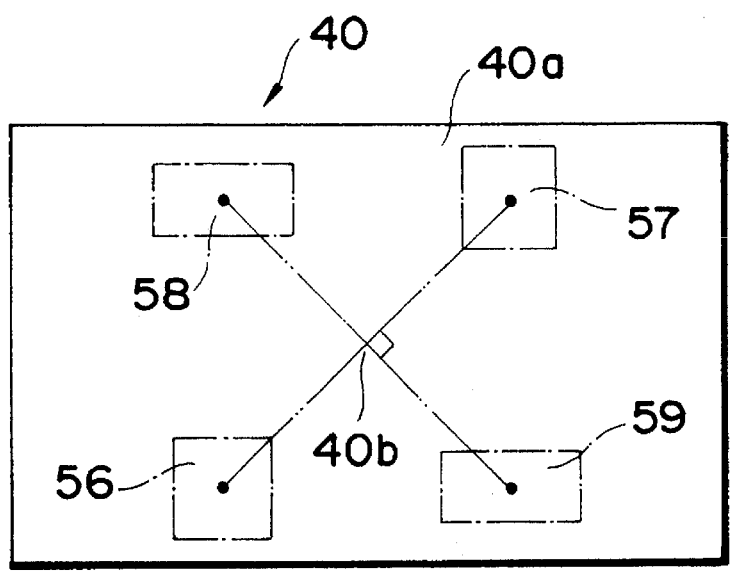
FIG. 16 shows top views of arrangements of the flat area on the semiconductor chip.

In FIG. 16, two pairs of flat areas 56 and 57 and flat areas 58 and 59 are provided symmetrically about the center of gravity 40b of the packaging plane 40a of the semiconductor chip 40. In the present embodiment, since the parallelism between the semiconductor chip 40 and the packaging substrate 10 is measured at the four flat areas 56–59, the parallelism can be more accurately adjusted than the previous embodiment. Further, since the flat areas 56–59 in the present embodiment are arranged such that straight lines connecting the paired flat areas are substantially normal to each other, the parallelism can be accurately adjusted even if distortion or warp is included in the entire packaging plane 10a.

Figure 17:
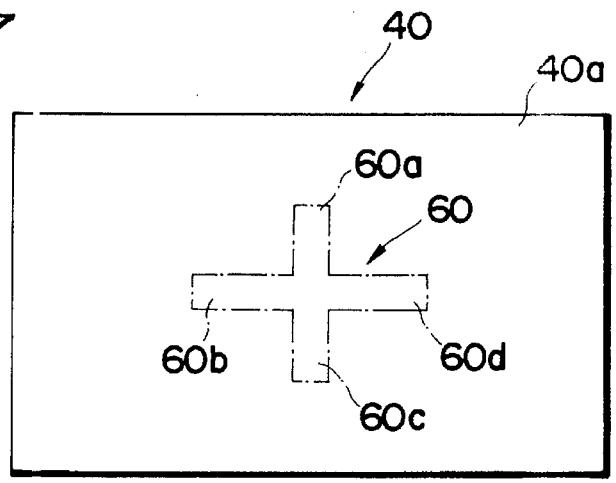
FIG. 17 shows top views of arrangements of the flat area on the semiconductor chip.

In FIG. 17, a cross-shaped flat area 60 is provided at a center of the packaging plane 40a of the semiconductor chip 40. A plurality of measurement points are selected from ends 60a–60d of the flat area 60 to measure the parallelism between the semiconductor chip 40 and the packaging substrate 10 so that the parallelism can be accurately adjusted even if distortion or warp is included in the entire packaging plane 40a.

Figure 18:
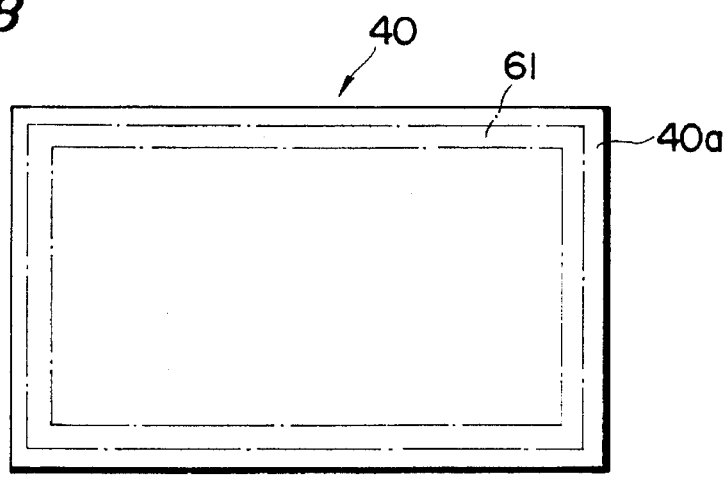
FIG. 18 shows top views of arrangements of the flat area on the semiconductor chip.

In FIG. 18, a band-like flat area 61 is provided at a periphery of the packaging plane 40a of the semiconductor chip 40. A plurality of measurement points on the flat area 61 are selected to measure the parallelism between the semiconductor chip 40 and the packaging substrate 10 so that the parallelism can be accurately adjusted.

Figure 19:
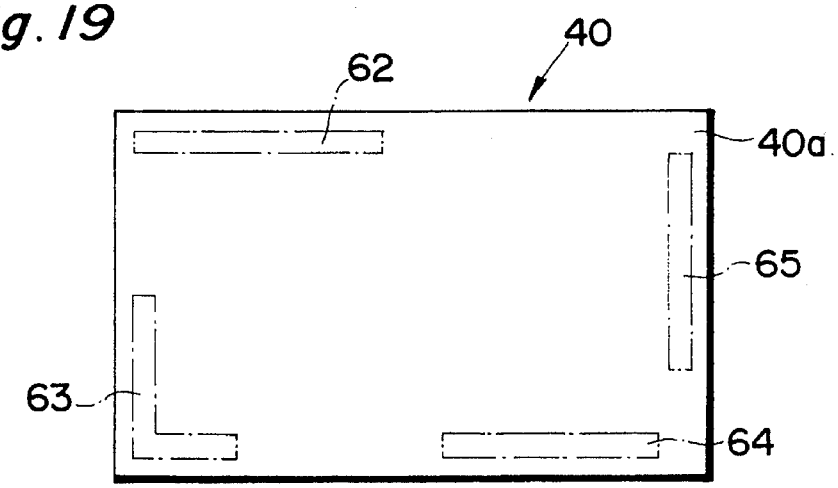
FIG. 19 shows top views of arrangements of the flat area on the semiconductor chip.

FIG. 19 shows a modification of the embodiment of FIG. 18. A plurality of flat areas 62–65 are provided at a periphery of the packaging plane 40a of the semiconductor chip 40. Like in the embodiment of FIG. 18, the parallelism can be accurately adjusted.

Figure 20:
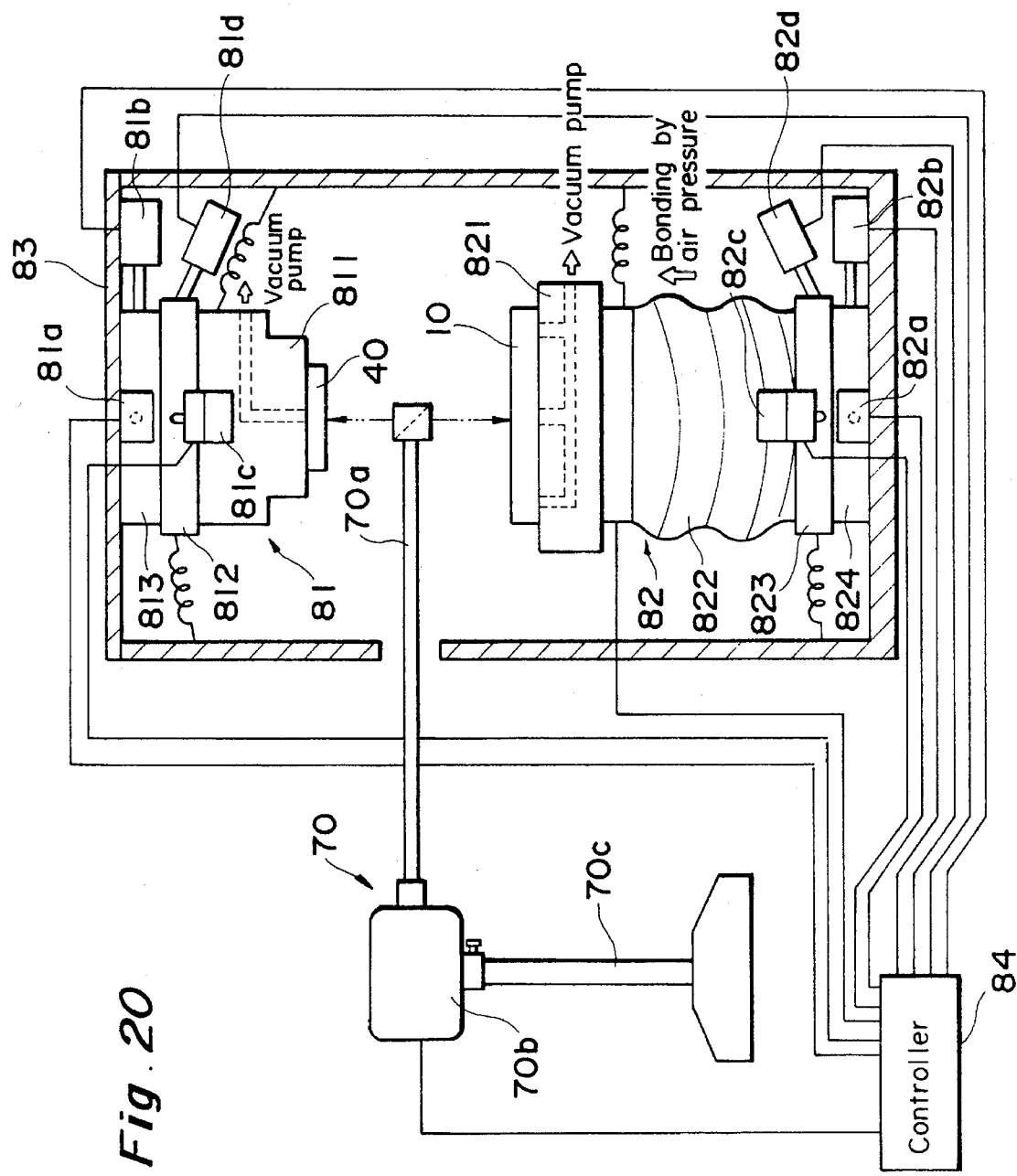
FIG. 20 shows a plan view of the packaging apparatus.

A packaging apparatus for packaging the semiconductor chip 40 to the packaging substrate 10 is now explained with reference to FIG. 20. The packaging apparatus comprises a semiconductor chip mount unit 81 having the semiconductor chip 40 mounted on a bottom surface thereof by vacuum sucking and a substrate mount unit 82 having the packaging substrate 10 mounted on an upper surface thereof by vacuum sucking. The semiconductor chip mount unit 81 is fixed to a top of a frame 83 and the substrate mount unit 82 is fixed to a bottom of the frame 83. A parallelism measurement device 70 for measuring the parallelism between the packaging substrate 10 and the semiconductor chip 40 is provided between the semiconductor chip mount unit 81 and the substrate mount unit 82.

The parallelism measurement device 70 comprises an optical probe 70a for irradiating a probe light to the packaging substrate 10 and the semiconductor chip 40, a measurement unit 70b for measuring reflection angles of the probe light reflected by the packaging substrate 10 and the semiconductor chip 40, and a support member 70c for supporting the optical probe 70a and the measurement unit 70b.

The semiconductor chip mount unit 81 comprises a sucking block 811 for sucking the semiconductor chip 40, a swingable stage 812 having the sucking block 811 fixed thereto, and a horizontally movable stage 813 movable in a horizontal two-dimensional plane and having the swingable stage 812 fixed thereto. Actuators 81a and 81b for adjusting a direction parallel to the upper surface of the semiconductor chip 40 are provided on two planes which are perpendicular to the side of the horizontally movable stage 813, and actuators 81c and 81d for adjusting the inclination of the semiconductor chip 40 are provided on two planes which are perpendicular to the side of the swingable stage 812.

The substrate mount unit 82 comprises a sucking block 821 for sucking the packaging substrate 10, a vertically movable bonding mechanism 822 having the sucking block 821 fixed thereto, a swingable stage 823 having the bonding mechanism 822 fixed thereto, and a horizontally movable stage 824 movable in a horizontal two-dimensional plane and having the swingable stage 823 fixed thereto. Actuators 82a and 82b for adjusting a direction parallel to the upper surface of the packaging substrate 10 are provided on two planes which are perpendicular t the side of the horizontally movable stage 824, and actuators 82c and 82d for adjusting the inclination of the packaging substrate 10 are provided on two planes which are perpendicular to the side of the swingable stage 823.

The packaging apparatus further comprises a controller 84 for adjusting the parallelism between the packaging substrate 10 and the semiconductor chip 40. The controller 84 receives measurement data from the optical probe 70a and issues necessary commands to the actuators 81a–81d in accordance with the data.

Figure 21:
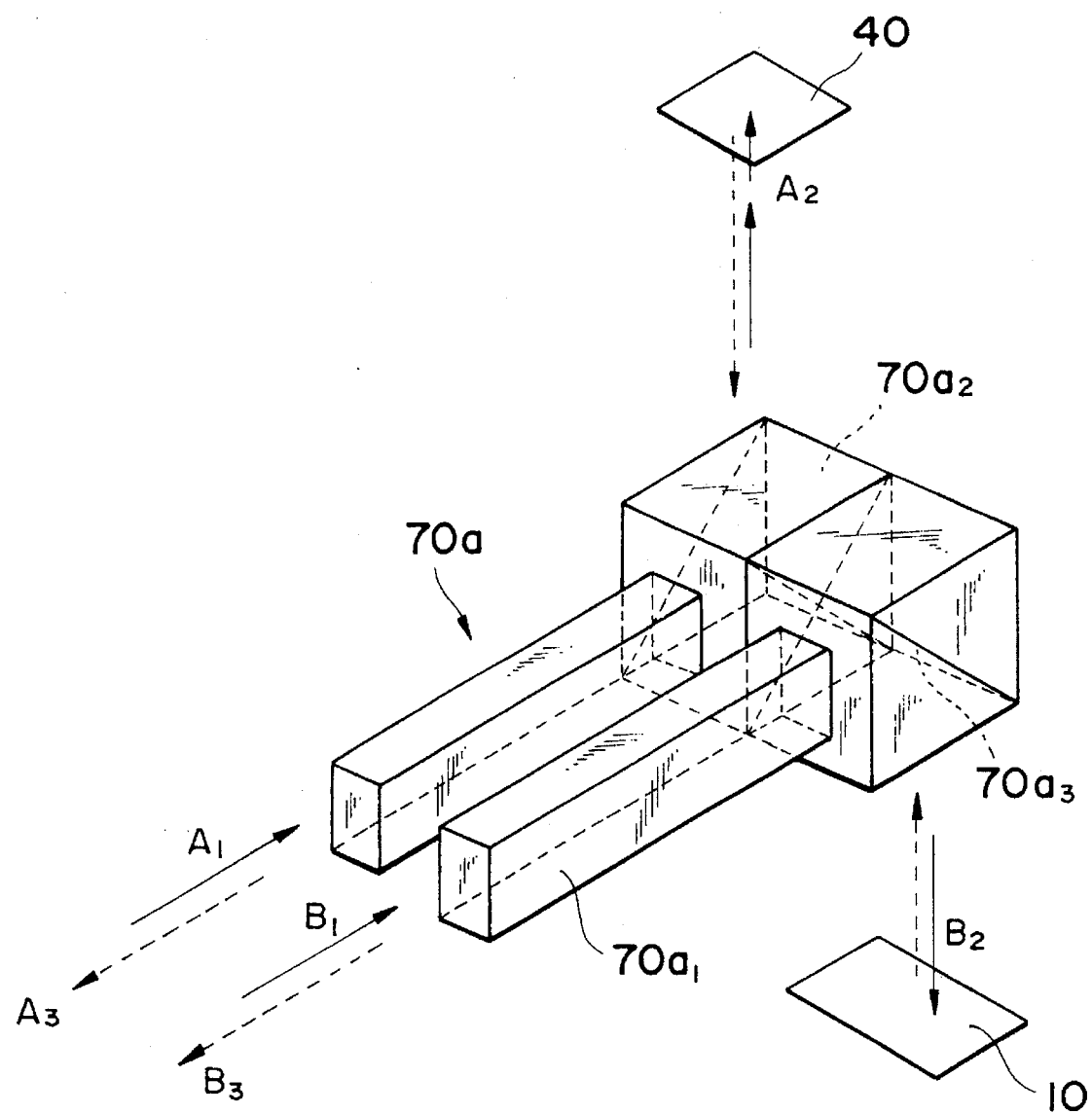
FIG. 21 shows a perspective view for illustrating a principle of measurement of an optical probe.

A principle of measurement of the optical probe 70a is now explained with reference to FIG. 21. Incident lights $A_1$ and $B_1$ parallelly directed from a light source pass through a light guide 70a$_1$, are reflected by reflection mirrors 70a$_2$ and 70a$_3$, and are directed to the lower surface of the semiconductor chip 40 and the upper surface of the packaging substrate 10. The illumination lights $A_2$ and $B_2$ are reflected by the lower surface of the semiconductor chip 40 and the upper surface of the packaging substrate 10 and exit through the reflection mirrors 70a$_2$ and 70a$_3$. The exit positions of the exit lights $A_3$ and $B_3$ are measured by a semiconductor position detector to determine a relative angular shift between the lower surface of the semiconductor chip 40 and the upper surface of the packaging substrate 10.

Turning back to FIG. 20, a packaging method by using the packaging apparatus is now explained. The semiconductor chip 40 is sucked by the sucking block 811 of the semiconductor chip mount unit 81 and the packaging substrate 10 is sucked by the sucking block 821 of the substrate mount unit 82. The parallelism between the packaging substrate 10 and the semiconductor chip 40 is measured by using the parallelism measurement device 70. The probe light directed to the packaging substrate 10 is accurately reflected by the flat area 20, and the probe light directed to the semiconductor chip is accurately reflected by the flat area 50. By measuring those reflected lights, the inclination between the packaging substrate 10 and the semiconductor chip 40 can be accurately detected.

The measurement data of the parallelism measurement device 70 is sent to the controller 84 which determines the parallelism between the packaging substrate 10 and the semiconductor chip 40. If the controller determines that the angle adjustment of the packaging substrate 10 is necessary, commands are issued to the actuators 82c and 82d of the packaging substrate mount unit 82 to conduct the necessary angle adjustment. If the controller 84 determines that the angle adjustment of the semiconductor chip 40 is necessary, commands are issued to the actuators 81c and 81d of the semiconductor chip mount unit 81 to conduct the necessary angle adjustment.

When the angle adjustment is completed, the parallelism measurement unit 70 is retracted. Then, the substrate mount unit 82 is lifted up and the semiconductor chip 40 is packaged on the packaging substrate 10. Since sufficient parallelism between the packaging substrate 10 and the semiconductor chip 40 has been attained in the previous angle adjustment process, all bumps on the semiconductor chips 40 can be connected to the pads on the packaging substrate 10. Accordingly, a high packaging yield is assured.

The reflection of the probe light is more accurate if the surface 10a of the packaging substrate 10 or the packaging plane 40a of the semiconductor chip 40 is polished. From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A packaging substrate for mounting a semiconductor, the substrate comprising:

a substrate layer;

metal film disposed over at least a portion of said substrate layer; and an insulation film having a thickness d formed at least on said metal film and defining a surface having at least one semiconductor chip packaging area, said metal layer and said insulation film cooperating to define at least one light reflecting area within a boundary of said at least one semiconductor chip packaging area, the thickness d of said insulation film satisfying the following relation:

$$(\lambda/2) \times m = n \times d$$

where $\lambda$ is a wavelength of incident light, m is an integer and n is a refractive index of said insulation film.

2. A packaging substrate according to claim 1 wherein a second insulation film different from said insulation film is formed between said packaging substrate and said metal film.

3. A packaging substrate according to claim 2 wherein said second insulation film is of single-layer structure made of PI (polyimide), BCB (benzocyclobutene) or SOG (spin-on-glass) or of multi-layer structure of a combination of said materials, and said second insulation film has a thickness of 5 μm or larger.

4. A packaging substrate according to claim 1 wherein said light reflecting area is arranged at a center of a semiconductor chip packaging area.

5. A packaging substrate according to claim 4 wherein said light reflecting area is of cross shape.

6. A packaging substrate according to claim 1 wherein at least one pair of light reflecting areas are provided and arranged symmetrically about a center of a semiconductor chip packaging area.

7. A packaging substrate according to claim 6 wherein two pairs of said light reflecting areas are arranged symmetrically, about the center of gravity of a semiconductor chip packaging area, and two straight lines connecting centers of the pairs of said light reflecting areas are substantially normal to each other.

8. A packaging substrate according to claim 1 wherein said light reflecting area is arranged in a band at periphery of a semiconductor chip packaging area.

9. A packaging substrate according to claim 1 wherein at least first and second light reflecting areas are provided, a portion of said second light reflecting area partially overlapping with a portion of said first light reflecting area.

10. A packaging substrate according to claim 9 wherein said second light reflecting area has a second metal film and a second transparent insulation film formed on said second metal film.

11. A packaging substrate according to claim 10 wherein a thickness d of said second transparent insulation film meets the following relation;

$$(\lambda/2) \times m = n \times d$$

where $\lambda$ is a wavelength of an incident light m is an integer and n is a refractive index of said third insulation film.

12. A packaging substrate according to claim 9 wherein said second light reflecting area is arranged at a center of a semiconductor chip packaging area.

13. A packaging substrate according to claim 12 wherein said second light reflecting areas are of cross shape.

14. A packaging substrate according to claim 9 wherein at least one pair of said second light reflecting areas are arranged symmetrically about a center of a semiconductor chip packaging area.

15. A packaging substrate according to claim 14 wherein two pairs of said second light reflecting areas are arranged symmetrically about a center of a semiconductor chip packaging area, and two straight lines connecting centers of the pairs of said second light reflecting areas are substantially normal to each other.

16. A semiconductor device according to claim 1 wherein said light reflecting area is arranged at a peripheral portion of a semiconductor chip packaging area.

17. A substrate member having a main surface for receiving a semiconductor chip to be mounted thereon, comprising:

a ceramic substrate having a main surface;

an insulation film formed directly on said main surface;

a light reflecting pattern formed on said insulation film on a region for receiving the semiconductor chip; and a transparent film covering said light reflecting pattern.

18. A substrate member having a main surface for receiving a semiconductor chip to be mounted thereon, comprising:

a packaging substrate; and a light reflecting pattern selectively formed on a region of said packaging substrate for receiving the semiconductor chip, the light reflecting pattern including a metal film and a transparent insulation film formed at least on the metal film.

\* \* \* \* \*